US012699814B2

(12) United States Patent
Al-Hussain et al.

(10) Patent No.: US 12,699,814 B2
(45) Date of Patent: Aug. 4, 2026

(54) AUTOMATIC CALIBRATION FOR A WATER INJECTION NETWORK MODEL

(71) Applicant: SAUDI ARABIAN OIL COMPANY, Dhahran (SA)

(72) Inventors: Hassan A. Al-Hussain, Dhahran (SA); Said S. Al-Malki, Dhahran (SA); Mohammed J. Alshakhs, Arawabi (SA); Vivek Kumar Singh, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 1191 days.

(21) Appl. No.: 17/645,134

(22) Filed: Dec. 20, 2021

(65) Prior Publication Data

US 2023/0195957 A1 Jun. 22, 2023

(51) Int. Cl.
*G06F 30/18* (2020.01)
*E21B 43/20* (2006.01)
*G06F 30/28* (2020.01)

(52) U.S. Cl.
CPC .............. *G06F 30/18* (2020.01); *E21B 43/20* (2013.01); *G06F 30/28* (2020.01); *E21B 2200/20* (2020.05)

(58) Field of Classification Search
CPC .......... G06F 30/18; G06F 30/28; E21B 43/20
See application file for complete search history.

(56) References Cited

U.S. PATENT DOCUMENTS

| | | | |
|---|---|---|---|
| 8,688,426 B2* | 4/2014 | Al-Shammari | ......... E21B 43/16 703/5 |
| 9,347,288 B2 | 5/2016 | Clemens et al. | |
| 10,013,512 B2 | 7/2018 | Bailey et al. | |
| 10,311,173 B2* | 6/2019 | Havre | ..................... G06F 30/18 |

(Continued)

FOREIGN PATENT DOCUMENTS

| | | | |
|---|---|---|---|
| AU | 2016271165 B2 | 7/2019 | |
| CN | 110185434 B * | 3/2023 | ............. E21B 47/12 |

(Continued)

OTHER PUBLICATIONS

EngineersEdge retrieved from the wayback machine as of Apr. 2021. (Year: 2021) EngineersEdge, Continutiy Equation Fluids Flow, https://www.engineersedge.com/fluid_flow/continuity_equation. htmhttps://web.archive.org/web/20210421093557/https://www. engineersedge.com/fluid_flow/continuity_equation.htm.*

(Continued)

*Primary Examiner* — Ryan F Pitaro
*Assistant Examiner* — Adrian Stoica
(74) *Attorney, Agent, or Firm* — Osha Bergman Watanabe & Burton LLP

(57) ABSTRACT

A method for calibrating a water injection network model includes obtaining measurements at a wellhead for a plurality of injection wells included in an injection pipeline network and determining an injection rate reconciliation for the plurality of injection wells. This method further includes dividing the injection pipeline network into a plurality of main-loops and subdividing the plurality of main-loops into a plurality of sub-loops. A friction factor multiplier is determined to match a simulated pressure drop in each of the plurality of sub-loops to a measured pressure drop at the wellhead and the water injection network model is calibrated by using the friction factor multiplier.

6 Claims, 4 Drawing Sheets

(56) References Cited

U.S. PATENT DOCUMENTS

| | | | |
|---|---|---|---|
| 2003/0093236 A1 | 5/2003 | Wu et al. | |
| 2009/0276100 A1* | 11/2009 | Malki | E21B 49/008 |
| | | | 700/282 |
| 2012/0158378 A1* | 6/2012 | Enchery | G01V 11/00 |
| | | | 703/2 |

FOREIGN PATENT DOCUMENTS

| | | |
|---|---|---|
| EP | 2486236 B1 | 6/2017 |
| RU | 2567067 C1 | 10/2015 |
| WO | 2012036633 A1 | 3/2012 |

OTHER PUBLICATIONS

CN-110185434-B Chinese original (Year: 2019).*
Engineersedge https://web.archive.org/web/20210421093557/https://www.engineersedge.com/fluid_flow/continuity_equation.htm (Year: 2021).*
Google translation of Image section of CN 110185434 B (Year: 2019).*
CN-110185434-B English (Year: 2019).*
Carpenter, C.; "Compositional Simulation, Artificial Intelligence Optimize Water Injection"; Journal of Petroleum Technology, Aug. 31, 2020 (9 pages).
Vadicharla, G. et al.; "Optimization Techniques for History Matching and Production Forecasting"; International Journal of Recent Technology and Engineering (IJRTE), vol. 8, No. 4, Nov. 2019 (11 pages).
Das, M. et al.; "Optimizing Production & Operation through Automated Well & Network Modeling"; Society of Petroleum Engineers, SPE-175205-MS (11 pages).
Fagbowore, O.; "Automated Production Network Model Calibration and Optimization in Agbami Field"; Society of Petroleum Engineers, SPE-203667-MS (12 pages).
First Examination Report issued in Saudi Arabian Application No. 122440902, dated Feb. 24, 2025 (9 pages).

* cited by examiner

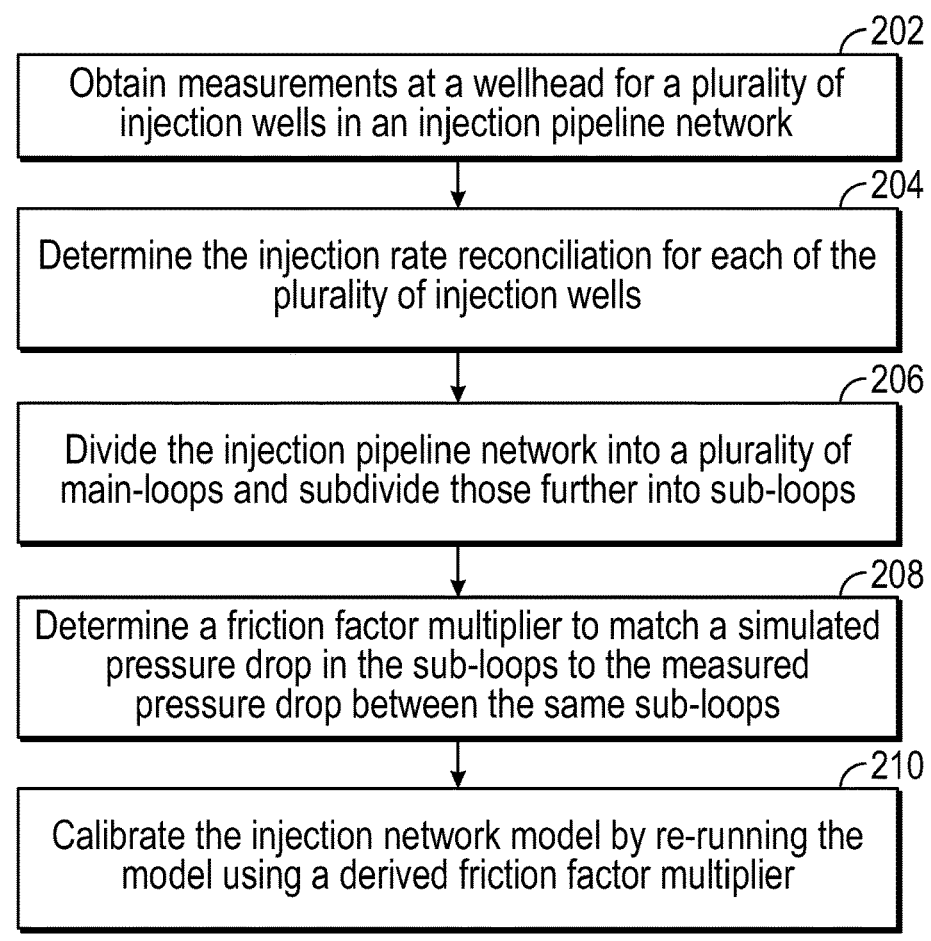

Obtain measurements at a wellhead for a plurality of injection wells in an injection pipeline network ⌐202

Determine the injection rate reconciliation for each of the plurality of injection wells ⌐204

Divide the injection pipeline network into a plurality of main-loops and subdivide those further into sub-loops ⌐206

Determine a friction factor multiplier to match a simulated pressure drop in the sub-loops to the measured pressure drop between the same sub-loops ⌐208

Calibrate the injection network model by re-running the model using a derived friction factor multiplier ⌐210

FIG. 2

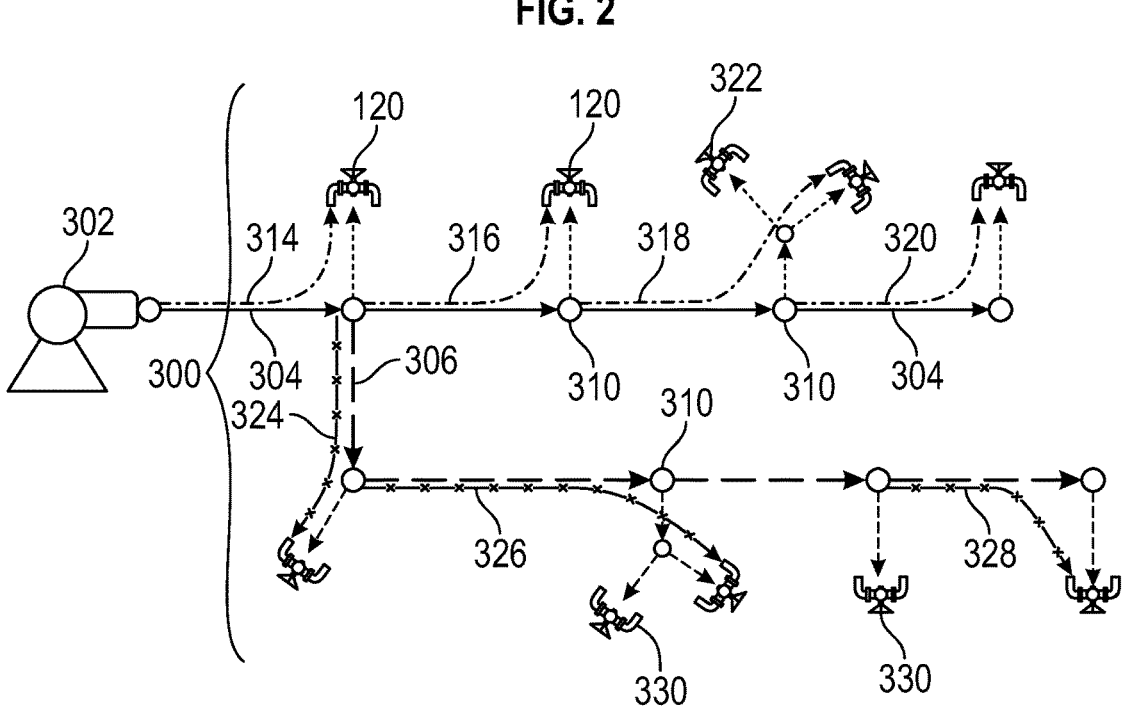

FIG. 3

AUTOMATIC CALIBRATION FOR A WATER INJECTION NETWORK MODEL

BACKGROUND

In the petroleum industry, hydrocarbons are located in reservoirs far beneath the Earth's surface. Wells are drilled into these reservoirs to access and produce the hydrocarbons. Wells are structures that include casing strings, cement, and various production equipment. There are many different drilling methods to recover hydrocarbons most effectively. Primary recovery or primary production is the initial stage in the hydrocarbon extraction process. Primary recovery is achieved through a production well and relies on the natural difference in pressure between the surface and the underground reservoir. Other mechanical systems such as pumps may be used to help force the hydrocarbons to the surface. As the hydrocarbons are gradually extracted by the production well, the pressure underground will slowly decrease, and the volume of hydrocarbon being produced will decrease.

There are times within the hydrocarbon extraction, where a pressure increase is needed to encourage the flow of the hydrocarbons within a region of interest. Secondary recovery or enhanced oil recovery may be used to maintain the reservoir pressure and displace hydrocarbons towards the production well. The most common secondary recovery techniques include gas injection and waterflooding. Waterflooding involves drilling water injection wells into a reservoir and introducing water into that reservoir to encourage hydrocarbon extraction. The injected water helps to increase depleted pressure within the reservoir and move the hydrocarbons through the reservoir to the production well, where it can be recovered.

A drilling operation may include any number of water injection wells connected by an injection pipeline network. Water is usually injected in the field through several water injection pumps located in a water injection plant and then distributed to various water injection wells. A typical water injection network model is used in a drilling operation to find the optimum injection strategy, perform different what-if injection scenarios, and detect bottlenecks in production. Before using a water injection network model for a drilling operation, it must be calibrated to match the observed injection system performance. Performing a model calibration refers to the process of applying a unique set of model parameters that provide a good description of the system behavior, in this case, the injection system.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a method for calibrating a water injection network model. This method includes obtaining measurements at a wellhead for a plurality of injection wells included in an injection pipeline network and determining an injection rate reconciliation for the plurality of injection wells. This method further includes dividing the injection pipeline network into a plurality of main-loops and subdividing the plurality of main-loops into a plurality of sub-loops. A friction factor multiplier is determined to match a simulated pressure drop in each of the plurality of sub-loops to a measured pressure drop at the wellhead and the water injection network model is calibrated by using the friction factor multiplier.

In general, in one aspect, embodiments relate to a non-transitory computer readable medium storing instructions executable by a computer processor, the instructions including functionality for obtaining measurements at a wellhead for a plurality of injection wells included in an injection pipeline network, determining an injection rate reconciliation for the plurality of injection wells, dividing the injection pipeline network into a plurality of main-loops and subdividing the plurality of main-loops into a plurality of sub-loops, determining a friction factor multiplier to match a simulated pressure drop in each of the plurality of sub-loops to a measured pressure drop at the wellhead and calibrating the water injection network model by using the friction factor multiplier.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

FIG. 2 shows a flowchart in accordance with one or more embodiments.

FIG. 3 shows a system in accordance with one or more embodiments.

DETAILED DESCRIPTION

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

The embodiments disclosed herein describe methods for automatically calibrating a water injection network model. A water injection network model calibration is usually performed to update some of the water injection network model parameters to better represent the field injection system performance. The methods include obtaining measurements at a wellhead for a plurality of injection wells in an injection pipeline network. The method then describes determining an injection rate reconciliation or a corrected injection rate for each of the plurality of injection wells. The method then describes dividing the injection pipeline network into a plurality of main-loops and subdividing the plurality of main-loops into sub-loops. A friction factor multiplier is then calculated to match a simulated pressure drop to a measured pressure drop within a sub-loop. Once the friction factor has been determined, the water injection network model is calibrated by re-running the model applying the friction factor for each sub-loop. The water injection network model is calibrated automatically to update the model to better represent the field injection system performance.

Figure 1:
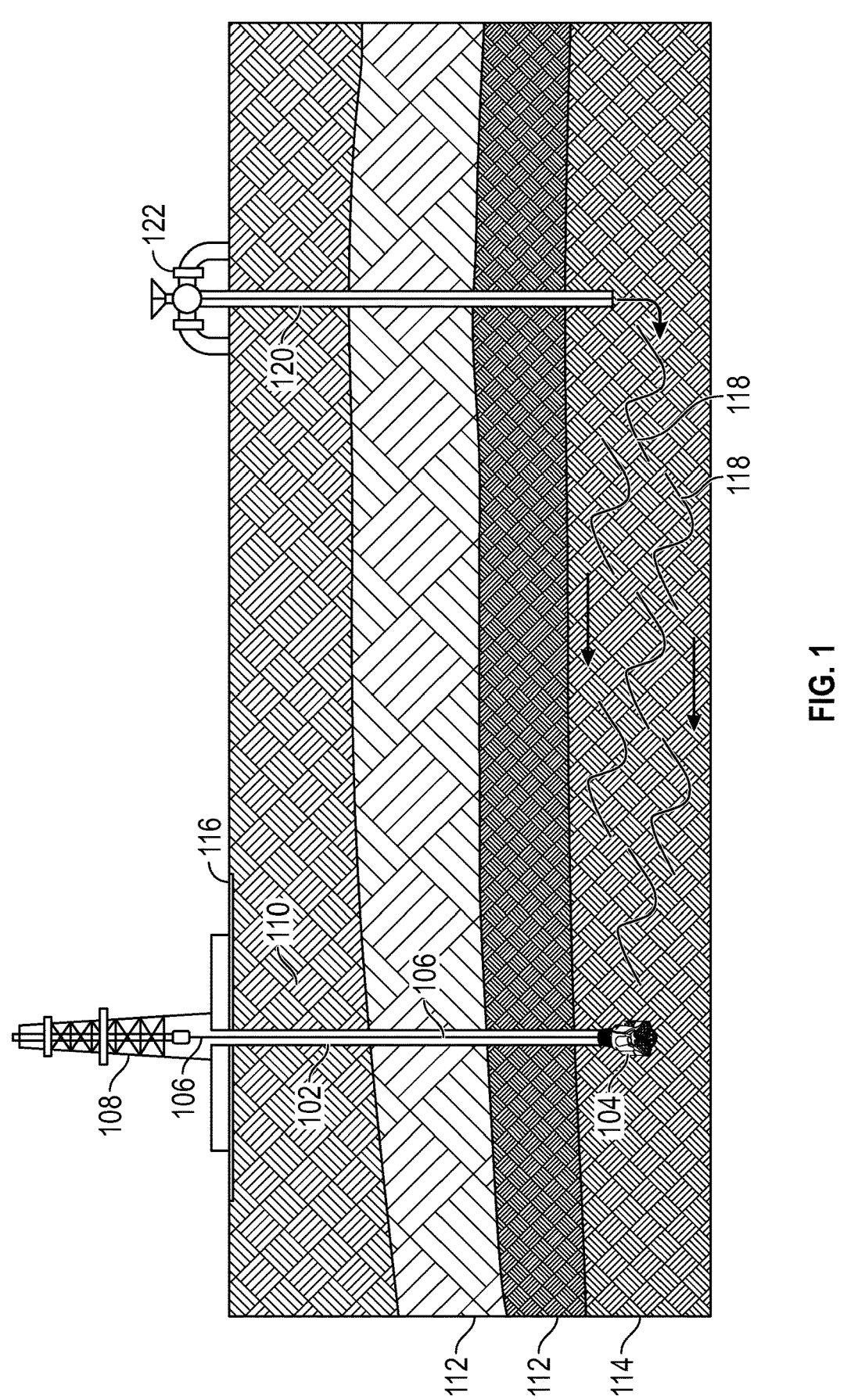
FIG. 1 shows a system in accordance with one or more embodiments.

FIG. 1 illustrates a system in accordance with one or more embodiments. As shown in FIG. 1, a production well (102) may be drilled by a drill bit (104) attached by a drill pipe (106) to a drill rig (108) located on the Earth's surface (116). The production well (102) may traverse a plurality of overburden layers (110) and one or more cap-rock layers (112) to a hydrocarbon reservoir (114). The production well (102) extracts hydrocarbons to Earth's surface (116) and relies on the natural difference in pressure between Earth's surface (116) and the hydrocarbon reservoir (114). An injection well (120) attached to a wellhead (122) on Earth's surface (116) may also be drilled in proximity to the production well (102). Water (118) is injected down the injection well (120) into the hydrocarbon reservoir (114) to aid in the hydrocarbon extraction. The injected water (118) helps to increase depleted pressure within the hydrocarbon reservoir (114) and move the hydrocarbons to the production wells (102), where it can be recovered.

A drilling operation may include any number of injection wells (120) connected at the wellhead (122) to an injection pipeline network. Water (118) is usually injected in the field through several water injection pumps located in a water injection plant and then distributed to various water injection wells (120). Measurement devices are usually installed across several selected nodes covering the entire injection pipeline network to collect data which helps to accurately monitor the water injection conditions both at the plant level and the injection well (120) level. This data collected can be used to analyze performance and detect problems at each individual well flowline. A well flowline refers to the specific pipeline section from a main pipeline to the wellhead (122).

A water injection drilling operation will often utilize a water injection network model that reflects the current field conditions. A water injection network model may be used to detect bottlenecks, perform different what-if injection scenarios and find the optimum injection strategy for a drilling operation. An injection network model must be calibrated prior to use, in part, by using the data obtained from measurement devices.

FIG. 2 shows a flowchart in accordance with one or more embodiments. The flowchart outlines a method for automatically calibrating a water injection network model to match actual measured injection rates and pressure drop across individual water injection pipelines. While the various blocks in FIG. 2 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Step 202, and in accordance with one or more embodiments, pressure and temperature measurements are obtained for an injection pipeline network. Pressure and temperature measurements should be made available downstream of pumps and at each wellhead (122). Accurate measurements expanding the entire injection pipeline network helps to monitor the injection system performance, identify any problems and determine any pressure drop between pipeline segments. The measurements are also important in calculating a reconciled injection rate or corrected injection rate, for the injection pipeline network. If no pressure and temperature measurements are available at a wellhead (122), then the corresponding well flowline will be excluded from the subsequent model calibrations, and the total injection from the pump will be reduced in the simulation accordingly.

In Step 204, and in accordance with one or more embodiments, an injection rate reconciliation or ReconciledInjectionRate$_i$, is determined for each of the plurality of injection wells. A ReconciledInjectionRate$_i$ is a corrected water injection rate for each water injection well.

The total water being injected in the field or TotalInjectionRate, is often measured with at least two flowmeters giving pressure and temperature readings located downstream of pumps. This TotalInjectionRate, determined from at least two flowmeters downstream of pumps, is further matched with water volume rate measurements from the water treatment facility feeding the pumps. Comparing measurements at multiple locations is necessary to ensure that the total water injection rate measured in the field is accurate and suitable to be used for model calibration. Water injection rate measurements are available at each well and denoted as, InjectionRate$_i$. The sum of water injected at each wellhead (122) should be within an allowable limit compared to the total water injection measurement, TotalInjectionRate, for the entire field.

Once the measurements are obtained and determined accurate, the water injection rate measurements for each well are then reconciled or corrected given by:

$$ReconciledInjectionRate_i = \frac{TotalInjectionRate}{\sum_{j=1}^{n=Total\ Wells}(InjectionRate_j)} \quad \text{Equation (1)}$$

where Total Wells is the total water injection wells in the injection pipeline network. If there is not a measurement at a particular well, then the well is omitted from the Total Wells count in Equation (1) and the measured injection rates are adjusted accordingly. The entire corresponding well flowline will also be excluded from the calibration.

In Step 206, and in accordance with one or more embodiments, the injection pipeline network is divided into main-loops and additionally subdivided into sub-loops. The injection pipeline network is first split into various main-loops. There may be an unlimited amount of main-loops. The main-loops of an injection pipeline network consist of the pipelines that have relatively the highest diameter and the longest sections. Start and end point of the main-loop is provided as input from user and this manual selection of these main-loops for a pipeline injection network are specific for the individual injection pipeline network.

For each main-loop that has been identified, it is further subdivided into sub-loops. The sub-loops are the individual pipeline sections that branch off from the main-loop at a "node" and are connected to an individual injection wellhead (122). If no measurements are made available at an individual injection wellhead (122), the injection well (120)

is excluded from sub-loops. An injection pipeline network split into main-loops and sub-loops is further illustrated in FIG. 3.

The sum of the pressure measured at each individual wellhead (122) is not expected to equal the total pressure that is introduced into the injection pipeline network. The injection pipeline network will experience some pressure drop or pressure loss within the sub-loops because of resistance to flow. The resistance to flow may be caused by friction between the fluid and the wall of the pipe, friction between adjacent layers of the fluid itself and friction loss as the fluid passes through any pipe fittings, bends, valves, or components. Pressure loss due to a change in elevation of the fluid may also account for pressure changes in a pipeline. To accurately calibrate a model for a network pipeline injection system, the simulated pressure drop or pressure loss, must accurately resemble the pressure drop measured in the field for each sub-loop.

In step 208, and in accordance with one or more embodiments, a friction factor multiplier is determined to match a simulated pressure drop in a sub-loop to the measured pressure drop between the same sub-loop. The simulated pressure drop in the sub-loop is determined by a network flow simulator or NFS. A NFS is a simulation tool, where a user provides wellhead injection rates and simulated pressure drop can be output. An accurate water injection network model must account for the actual pressure drop experienced in field conditions, so the simulated pressure drop $\Delta P_{base}$ is matched with the actual pressure drop based on field measurements $\Delta P_{act}$ by a friction factor, f, given by:

$$\Delta P_{act,ML\text{-}x,SL\text{-}y} = \Delta P_{base,ML\text{-}x,SL\text{-}y} \times f_{ML\text{-}x,SL\text{-}y} \qquad \text{Equation (2)}$$

where $_{ML\text{-}x,\ SL\text{-}y}$ is the sub-loop y, corresponding to the main-loop x.

In step 210, and in accordance with one or more embodiments, the water injection network model is automatically calibrated, by applying the derived friction factor multiplier to each eligible sub-loops and re-running the model with the new parameters. Once the model is automatically calibrated against actual field performance, the water injection network model can be used to detect bottlenecks, perform different what-if injection scenarios, and find the optimum injection strategy.

This method to automatically calibrate the water injection network model, may be done continuously on a drilling operation to match measured injection rates and pressure drops across individual injection pipelines over time. Steps 204 through 210 in FIG. 2 are automated using a coded script rather than manual calculations. The algorithm used to develop the automated script is presented in further detail in FIG. 4.

FIG. 3 further illustrates an example of an injection pipeline network (300) split into main-loops and sub-loops. A water injection pump (302) distributes water to an injection pipeline network (300) through interconnected pipelines, connected to one another at a node (310). A user manually selects, using diameter and length measurements, two main-loops for the injection pipeline network (300), main-loop 1 or ML1 (304) and main-loop 2 or ML2 (306). For ML1 (304), the system is further divided into sub-loops or SL identified by the dash-dot pattern line, coming from a node (310) on ML1 and extending to an injection well (120). There may be one or more injection wells (120) included in a sub-loop. The sub-loops identified in ML1 are sub-loop 1 or ML1-SL1 (314), ML1-SL2 (316), ML1-SL3 (318) and ML1-SL4 (320). For illustrative purposes, the injection well (322) has been omitted from the formation of sub-loops due to measurements being unavailable at the wellhead (122).

Main-loop 2 or ML2 (306) has also been subdivided into sub-loops, identified by the dash-x pattern line, coming from a node (310) on ML2 and extending to an injection well (120). An injection well (120) which has been previously included in a sub-loop of ML1, cannot be included in the sub-loops of ML2. The sub-loops identified in ML2 are sub-loop 1 or ML2-SL1 (324), ML2-SL2 (326) and M12-SL3 (328). For illustrative purposes, the injection wells (330) have been omitted from the formation of sub-loops due to measurements unavailable at the wellhead (122). While FIG. 3 demonstrates one possible example of how a particular injection pipeline network (300) can be divided into main-loops and sub-loops, the actual division will depend on a user selection, using diameter and length measurements, for the actual injection pipeline network.

Figure 4:
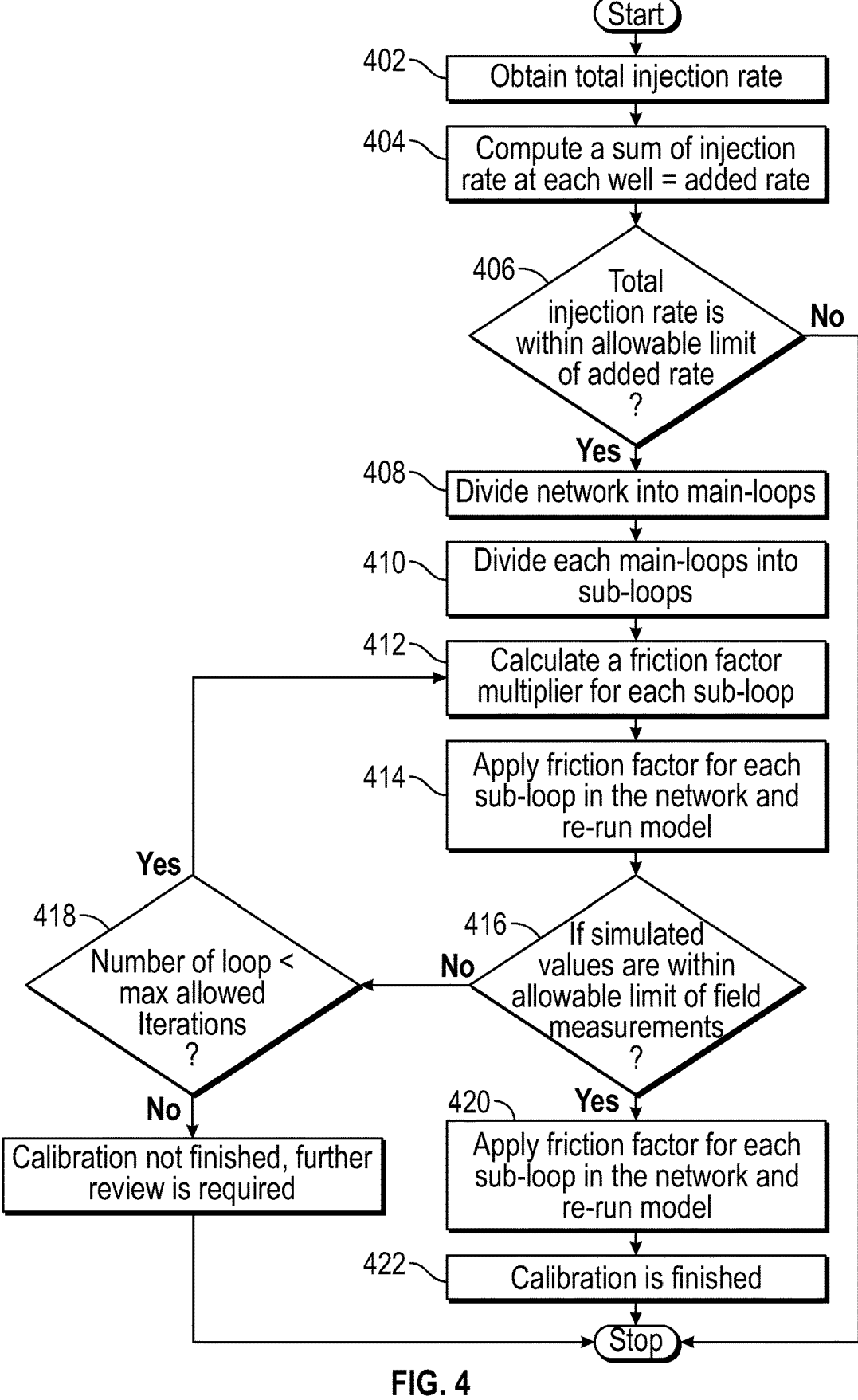
FIG. 4 shows an algorithm in accordance with one or more embodiments.

FIG. 4 depicts the algorithm used to develop the automated script which calibrates the water injection network model. In step 402, and in accordance with one or more embodiments, the total injection rate is obtained. The total injection rate is often measured with at least two flowmeters located downstream of pumps. The measurements should be made at multiple locations to ensure accuracy and the measured rate should be further matched with water volume rate measurements from the water treatment facility feeding the pumps.

In step 404, and in accordance with one or more embodiments, the sum of the injection rate at each injection well or added rate, is obtained. If there are no measurements at an injection well, the corresponding well flowline will be excluded from calibration and the total injection from the pump will be reduced accordingly.

In step 406, and in accordance with one or more embodiments, the total injection rate is compared to the added rate, and a reconciled injection rate is determined, according to equation (1). If the injection rate is within an allowable limit to the added rate, the calibration process proceeds. If the injection rate is not within the allowable limit to the added rate, the process is terminated for further review.

In step 408, and in accordance with one or more embodiments, the injection pipeline network is divided into main-loops. The main-loop in the injection network consists of pipelines that have relatively the highest diameter and the longest sections. Start and end point of the main-loop is provided as an input from user, and this manual selection of these main-loops for a pipeline injection network are specific for the individual injection pipeline network.

In step 410, and in accordance with one or more embodiments, each of the main-loops are divided into sub-loops. If measurements aren't made available at any injection well, then the corresponding injection well is to be excluded from sub-loops.

In step 412, and in accordance with one or more embodiments, a friction factor multiplier for each sub-loop is determined. A friction factor multiplier is determined to match a simulated pressure drop in a sub-loop to the measured pressure drop between the same sub-loop. The simulated pressure drop in the sub-loop is determined by a network flow simulator or NFS. The friction factor multiplier helps the model reflect the actual field pressure loss measurements.

In step 414, and in accordance with one or more embodiments, the friction factor multiplier is applied for each sub-loop in the injection pipeline network and the model is re-run.

In step 416, and in accordance with one or more embodiments, if the simulated values from the re-ran model are within an allowable limit of field measurements, then the friction factor is applied for each sub-loop in the network and the model is re-run, according to step 420, and the calibration is finished as shown in step 422.

If the simulated values from the re-ran model are not within an allowable limit of field measurements, then the algorithm re-attempts the process and returns to step 412 to calculate a new friction factor multiplier. For each new friction factor multiplier created, a loop is counted. The number of loops is counted and compared to a maximum allowed iteration value at step 418. If the number of loops experienced is less than the maximum allowed iterations, then the process starts over at step 412. If at step 418, it is determined that the number of loops have exceeded the maximum allowed iterations, then the calibration is not complete and further review is required.

Figure 5:
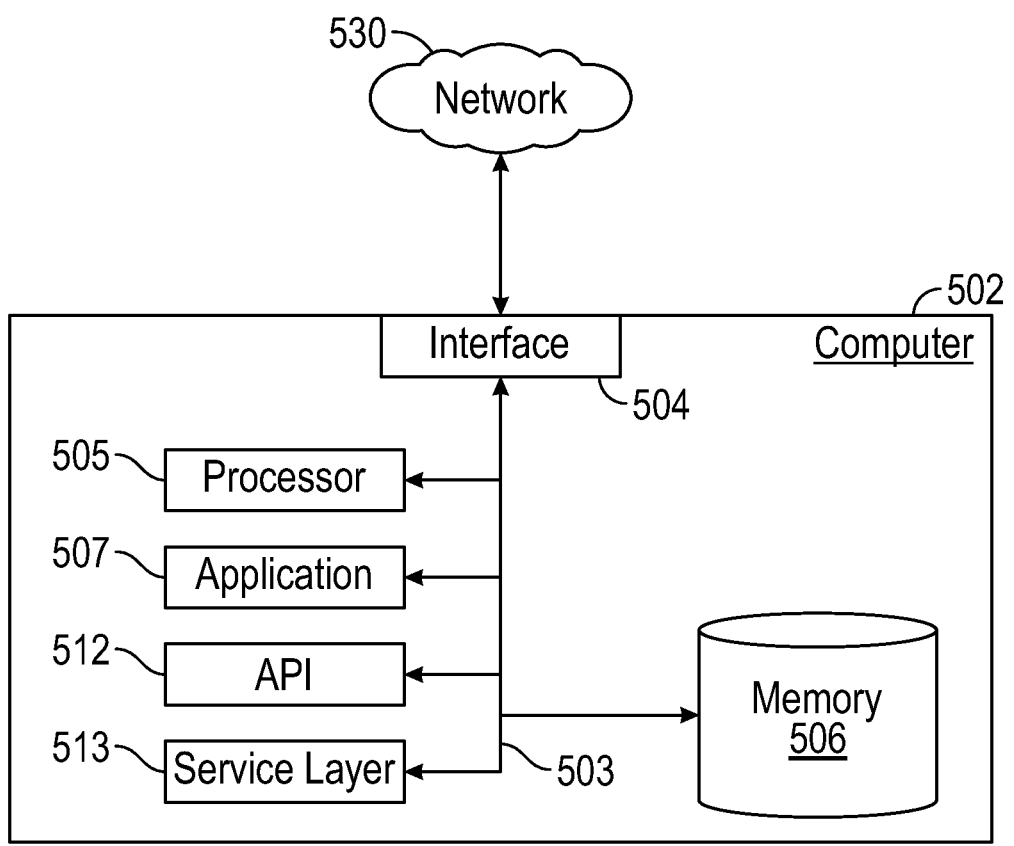
FIG. 5 shows a system in accordance with one or more embodiments.

FIG. 5 depicts a block diagram of a computer system (502) used to provide computational functionalities associated with described algorithms, methods, functions, processes, flows, and procedures as described in this disclosure, according to one or more embodiments. The illustrated computer (502) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (502) may include a computer that includes an input device, such as a keypad, keyboard, touch screen, or other device that can accept user information, and an output device that conveys information associated with the operation of the computer (502), including digital data, visual, or audio information (or a combination of information), or a GUI.

The computer (502) can serve in a role as a client, network component, a server, a database or other persistency, or any other component (or a combination of roles) of a computer system for performing the subject matter described in the instant disclosure. The illustrated computer (502) is communicably coupled with a network (530). In some implementations, one or more components of the computer (502) may be configured to operate within environments, including cloud-computing-based, local, global, or other environment (or a combination of environments).

At a high level, the computer (502) is an electronic computing device operable to receive, transmit, process, store, or manage data and information associated with the described subject matter. According to some implementations, the computer (502) may also include or be communicably coupled with an application server, e-mail server, web server, caching server, streaming data server, business intelligence (BI) server, or other server (or a combination of servers).

The computer (502) can receive requests over network (530) from a client application (for example, executing on another computer (502) and responding to the received requests by processing the said requests in an appropriate software application. In addition, requests may also be sent to the computer (502) from internal users (for example, from a command console or by other appropriate access method), external or third-parties, other automated applications, as well as any other appropriate entities, individuals, systems, or computers.

Each of the components of the computer (502) can communicate using a system bus (503). In some implementations, any or all of the components of the computer (502), both hardware or software (or a combination of hardware and software), may interface with each other or the interface (504) (or a combination of both) over the system bus (503) using an application programming interface (API) (512) or a service layer (513) (or a combination of the API (512) and service layer (513). The API (512) may include specifications for routines, data structures, and object classes. The API (512) may be either computer-language independent or dependent and refer to a complete interface, a single function, or even a set of APIs. The service layer (513) provides software services to the computer (502) or other components (whether or not illustrated) that are communicably coupled to the computer (502).

The functionality of the computer (502) may be accessible for all service consumers using this service layer. Software services, such as those provided by the service layer (513), provide reusable, defined business functionalities through a defined interface. For example, the interface may be software written in JAVA, C++, or other suitable language providing data in extensible markup language (XML) format or another suitable format. While illustrated as an integrated component of the computer (502), alternative implementations may illustrate the API (512) or the service layer (513) as stand-alone components in relation to other components of the computer (502) or other components (whether or not illustrated) that are communicably coupled to the computer (502). Moreover, any or all parts of the API (512) or the service layer (513) may be implemented as child or submodules of another software module, enterprise application, or hardware module without departing from the scope of this disclosure.

The computer (502) includes an interface (504). Although illustrated as a single interface (504) in FIG. 4, two or more interfaces (504) may be used according to particular needs, desires, or particular implementations of the computer (502). The interface (504) is used by the computer (502) for communicating with other systems in a distributed environment that are connected to the network (530). Generally, the interface (504 includes logic encoded in software or hardware (or a combination of software and hardware) and operable to communicate with the network (530). More specifically, the interface (504) may include software supporting one or more communication protocols associated with communications such that the network (530) or interface's hardware is operable to communicate physical signals within and outside of the illustrated computer (502).

The computer (502) includes at least one computer processor (505). Although illustrated as a single computer processor (505) in FIG. 5, two or more processors may be used according to particular needs, desires, or particular implementations of the computer (502). Generally, the computer processor (505) executes instructions and manipulates data to perform the operations of the computer (502) and any algorithms, methods, functions, processes, flows, and procedures as described in the instant disclosure.

The computer (502) also includes a memory (506) that holds data for the computer (502) or other components (or a combination of both) that can be connected to the network (530). For example, memory (506) can be a database storing data consistent with this disclosure. Although illustrated as a single memory (506) in FIG. 4, two or more memories may be used according to particular needs, desires, or particular implementations of the computer (502) and the described functionality. While memory (506) is illustrated as an integral component of the computer (502), in alternative implementations, memory (506) can be external to the computer (502).

The application (507) is an algorithmic software engine providing functionality according to particular needs, desires, or particular implementations of the computer (502), particularly with respect to functionality described in this disclosure. For example, application (507) can serve as one or more components, modules, applications, etc. Further, although illustrated as a single application (507), the application (507) may be implemented as multiple applications (507) on the computer (502). In addition, although illustrated as integral to the computer (502), in alternative implementations, the application (507) can be external to the computer (502).

There may be any number of computers (502) associated with, or external to, a computer system containing computer (502), wherein each computer (502) communicates over network (530). Further, the term "client," "user," and other appropriate terminology may be used interchangeably as appropriate without departing from the scope of this disclosure. Moreover, this disclosure contemplates that many users may use one computer (502), or that one user may use multiple computers (502).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, any means-plus-function clauses are intended to cover the structures described herein as performing the recited function(s) and equivalents of those structures. Similarly, any step-plus-function clauses in the claims are intended to cover the acts described here as performing the recited function(s) and equivalents of those acts. It is the express intention of the applicant not to invoke 35 U.S.C. § 112(f) for any limitations of any of the claims herein, except for those in which the claim expressly uses the words "means for" or "step for" together with an associated function.

What is claimed is:

1. A method for calibrating a water injection network model, the method comprising:

obtaining, via a plurality of devices, initial measurements for a plurality of injection wells that are included in an injection pipeline network, initial measurements comprise pressure and temperature data, wherein the plurality of devices are disposed at the wellhead and along a pipeline in the injection pipeline network;

obtaining, via at least two flow meters disposed downstream from a plurality of pumps fed from a water treatment facility, a first total injection rate of fluids being pumped;

determining, using a computer processor, an injection rate reconciliation for the plurality of injection wells in the injection pipeline network based on a comparison of the measurements and the total injection rate;

dividing, using initial measurements, the injection pipeline network into a plurality of main-loops;

subdividing, using measurements, the plurality of main-loops into a plurality of sub-loops;

determining, using the computer processor, a friction factor multiplier to match a simulated pressure drop in each of the plurality of sub-loops to a measured pressure drop at the wellhead;

calibrating, using the computer processor, the water injection network model using the friction factor multiplier to determine an optimum injection strategy for the injection pipeline network; and pumping, via the plurality of pumps, fluids through the plurality of injection wells to obtain new measurements using the plurality of devices and a new total injection rate via the at least two flow meters;

while pumping, continuously calibrating the water injection network model, based on the obtained new measurements and the second total injection rate, by automatically updating initial measurements and the first total injection rate with the water injection network model across the injection pipeline network over a period of time; and recalculating a new optimum injection strategy based on the continuous calibrated water injection network model.

2. The method of claim 1, wherein the total injection rate is further matched with water volume rate measurements from the water treatment facility feeding the plurality of pumps.

3. The method of claim 1, wherein dividing, using measurements, the injection pipeline network into the plurality of main-loops further comprises selecting at least two pipelines from the injection pipeline network that have a greatest diameter and a longest section in comparison to remaining pipelines in the injection pipeline network.

4. The method of claim 1, wherein subdividing, using measurements, the plurality of main-loops into the plurality of sub-loops further comprises defining a path between a node on one of the plurality of main-loops to each of the plurality of injection wells.

5. The method of claim 4, wherein subdividing, using measurements, the plurality of main-loops into the plurality of sub-loops further comprises excluding any one of the plurality of injection wells from the plurality of sub-loops which does not have measurements available at the wellhead.

6. The method of claim 1, wherein determining, using the computer processor, the friction factor multiplier to match a simulated pressure drop further comprises determining the simulated pressure drop by using a network flow simulator.

* * * * *